United States Patent [19]

Allen

[11] 4,321,535
[45] Mar. 23, 1982

[54] APPARATUS FOR MEASURING DYNAMIC MAGNETOSTRICTION USING ACCELEROMETERS

[75] Inventor: Jerry W. Allen, Hermitage, Pa.

[73] Assignee: Westinghouse Electric Corp., Pittsburgh, Pa.

[21] Appl. No.: 92,870

[22] Filed: Nov. 8, 1979

[51] Int. Cl.³ .................... G01B 7/24; G01R 33/18
[52] U.S. Cl. ................................. 324/209; 324/236; 324/262
[58] Field of Search ............... 324/209, 225, 228, 234, 324/236, 262

[56] References Cited

U.S. PATENT DOCUMENTS

| | | |
|---|---|---|
| 2,312,888 | 3/1943 | Everest . |
| 2,596,752 | 5/1952 | Williams . |
| 2,850,697 | 9/1958 | Little, Jr. . |
| 3,029,644 | 4/1962 | Loveless et al. . |
| 3,080,507 | 3/1963 | Wickerham et al. ............... 324/225 |
| 3,114,267 | 12/1963 | Mundo, Jr. . |
| 3,241,373 | 3/1966 | Ricketts et al. . |
| 3,336,154 | 8/1967 | Oberg et al. . |
| 3,793,890 | 2/1974 | Anderson et al. . |
| 3,807,223 | 4/1974 | Juillerat et al. . |
| 3,838,595 | 10/1974 | Godefroy . |
| 4,000,658 | 1/1977 | Schmidt . |
| 4,039,935 | 8/1977 | Wilson . |
| 4,041,377 | 8/1977 | Lyke . |
| 4,085,363 | 4/1978 | Gravina et al. . |

Primary Examiner—Gerard R. Strecker
Assistant Examiner—Walter E. Snow
Attorney, Agent, or Firm—D. R. Lackey

[57] ABSTRACT

An apparatus for measuring dynamic magnetostriction subjects a test sample to a spatially uniform, sinusoidal magnetic field of constant peak amplitude. Accelerometers mounted on the test sample produce a first electrical signal representative of the acceleration of the test sample due to the induced magnetic field. The first electrical signal is integrated twice producing a signal representative of the displacement of the test sample due to the induced magnetic field. This signal is representative of the magnetostrictive movement of the test sample.

13 Claims, 3 Drawing Figures

APPARATUS FOR MEASURING DYNAMIC MAGNETOSTRICTION USING ACCELEROMETERS

BACKGROUND OF THE INVENTION

1. Field of the Invention

This invention relates to devices for determining the magnetostrictive characteristics of a test specimen.

2. Description of the Prior Art

Magnetostriction is a phenomenon exhibited by certain ferromagnetic metals such as nickel, iron, cobalt, and manganese alloys, whereby the metal expands or contracts when exposed to a magnetic field. Electrical devices which operate by electromagnetic induction, such as transformers, are constructed of these ferromagnetic metals.

In a transformer, the core is constructed of a ferromagnetic metal having primary and secondary windings thereon. During operation, an alternating magnetic field is induced in the core by an alternating electric current applied to the windings. The frequency of the alternating magnetic field is equal to the frequency of the AC electric current applied to the windings. The alternating magnetic field causes the core of the transformer to expand and contract according to the polarity of the magnetic field. Thus, the cycle of expansion and contraction has a frequency equal to the frequency of the alternating magnetic field. The amount of expansion or contraction, which is the magnetostrictive movement, is related to the strength of the alternating magnetic field. The magnetostrictive movement is responsible for losses in the core of the transformer and is responsible for producing an audible noise or hum which may have deleterious effects on personnel continually working in the area. It is therefore advantageous to measure the magnetostrictive characteristics of a metal in order to minimize core losses and noise.

In U.S. Pat. No. 2,312,888, magnetostriction is measured by an apparatus utilizing mechanical levers and a monochromatic light source. A sample is supported under a desired tension in a vertical direction between a stationary support and a weight. A coil is provided for magnetizing the sample, the coil being supported so as to avoid contact with the sample. The weighted end of the sample is pivotally connected to a first end of a horizontal lever. The second end of the horizontal lever is pivotally connected through a vertical dummy sample to a second horizontal lever. The dummy sample is substantially the same as the sample to be tested. A second non-inductive coil is provided for heating the dummy sample. The second horizontal lever is pivotally connected at one end to the dummy sample and is connected at the other end to a transparent optically flat plate having a partially reflecting under-surface. A second and stationary optically flat plate having an upper reflecting surface is located beneath the first plate. A monochromatic light source is located above the plates. Since the two plates are located relatively close together, an interference pattern will be produced. The first horizontal lever is pivoted at its center so that elongations due to equal heating of the sample and the dummy sample will not cause any movement of the second horizontal lever. The movement conveyed to the second horizontal lever will therefore be that caused only by magnetostriction and not heating of the sample. As the second horizontal lever moves, it changes the location of the first plate relative to the second plate thus changing the interference pattern. By analysis of the interference pattern, the magnetostriction of the sample may be determined.

In U.S. Pat. No. 2,596,752, a test sample is vertically mounted at one end to a stationary horizontal test fixture. The second end of the test sample is connected to a movable grating. A dummy sample is vertically mounted at one end to the stationary horizontal test fixture. The second end of the dummy sample is connected to a fixed grating. The test sample is provided with damping weights to minimize the possibility of mechanical resonance and is provided with an inductive coil for magnetizing the sample. The dummy sample is provided with a non-inductive coil for heating the dummy sample. The fixed grating and the movable grating are positioned intermediate a light source and a photosensitive device. Expansion or contraction of the test sample produces a consequent displacement of the movable grating relative to the fixed grating thereby proportionally altering the amount of light reaching the photosensitive device through the gratings. Temperature changes accompanying the magnetization of the test sample are compensated by heating the dummy sample to the same temperature as the test sample such that the position of the fixed grating relative to the movable grating remains unchanged. Thus, any movement of the test sample relative to the dummy sample is due to magnetostriction and not heating. Analysis of the amount of light reaching the photosensitive device provides an indication of the magnetostriction of the test sample.

In U.S. Pat. No. 2,850,697, a variable capacitor is used to measure magnetostriction. A test sample is vertically suspended inside a coil by a clamping means. A first end of the test sample has a plain surface which cooperates with a fixed plate to provide a variable capacitor. The test sample is clamped at a point remote from that end of the sample which is acting as a plate of the variable capacitor. For test samples of small mass, the clamping point may be the opposite end of the test sample. For test samples of large mass, the clamping point should be a natural node region. The clamping means also provides an electrical connection between the test sample and ground. When the test sample is subjected to a magnetic field, its length will change thus changing the value of the variable capacitor. An analysis of the value of the variable capacitor will provide an indication of the magnetostriction of the test sample.

In U.S. Pat. No. 4,041,377, a displacement sensitive transducer is mechanically associated with a test sample for generating a magnetostriction signal reflecting the magnetostrictive deformation of the test sample in response to an induced magnetic field. The invention includes a timing circuit associated with the means for inducing the magnetic field in the test specimen. The timing circuit produces a series of timing signals identifying the occurrence of zero and maximum induction in the test sample. A conversion circuit operates under the control of the timing circuit for deriving a DC difference signal from the magnetostriction signal produced by the displacement transducer. The DC difference signal is proportional to the difference between the amplitudes of the magnetostriction signal corresponding to the occurrences of maximum and zero induction in the test sample. The DC difference signal, which reflects the magnetostrictive characteristics of the test sample, is applied to a display which produces a digital output corresponding to the magnitude and polarity of the DC difference signal.

Unique problems are encountered in attempting to measure magnetostriction since the movement to be measured is typically on the order of $10^{-7}$ meters per meter and a test sample may be only a few mils thick. Since the movement is so small and the test sample is not structurally rigid, the use of the four patents described above, which are representative of the prior art, is subject to certain limitations. Devices which relay upon a system of mechanical levers for measuring magnetostriction are not suitable for measuring periodic or dynamic magnetostriction due to elasticity mechanical resonance and inertia of the levers. Devices which have elements, such as a grating, suspended from the test sample, or which utilize damping weights will introduce undesirable strain in the test sample which may alter the sample's magnetostrictive characteristics. Devices which utilize mechanical clamps for holding the test sample or which have transducers mechanically connected to the test sample may restrict the movement of the test sample or may unduly complicate the positioning of the sample in the testing apparatus. The present invention is for an apparatus for measuring magnetostriction which overcomes these and other limitations of the prior art.

SUMMARY OF THE PRESENT INVENTION

The present invention is an apparatus for measuring dynamic magnetostriction along an axis of a test sample. A sheath-like fixture constructed of a material having a low magnetic permeability horizontally receives the test sample. The fixture has both a sensing coil and an excitation coil wound thereon. The excitation coil, energized by an amplifier, induces a spatially uniform, sinusoidal magnetic field of constant peak amplitude along the axis of the test sample. The sensing coil senses the induced magnetic field and produces a feedback signal for maintaining the sinusoidal shape and constant peak amplitude of the magnetic field. An accelerometer, rigidly mounted on the test sample, produces a first electrical signal representative of the acceleration of the test sample due to the induced magnetic field. The first electrical signal is integrated producing a second signal representative of the velocity of the test sample due to the induced magnetic field. The second signal is integrated producing a third signal representative of the displacement, or magnetostrictive movement, of the test sample along the axis due to the induced magnetic field.

The present invention has several important advantages over the prior art. One advantage of major importance is that the present invention requires no mechanical connections to the test sample. This is an important feature given that the movement to be measured is on the order of $10^{-7}$ meters per meter. A second advantage is that the present invention is immune to changes in length of the test sample caused by heating. Expansion caused by heating will not accelerate the test sample and thus changes in length due to heating will not be measured by the accelerometers. Accordingly, dummy samples and elaborate compensation schemes are not required. Another advantage of the present invention is that the test sample is oriented in a horizontal position. This horizontal orientation eliminates the need for any type of clamping which may effect the magnetostrictive movement of the sample. This orientation also eliminates stress and strain in the sample which may be found in samples oriented in a vertical position. The elimination of unwanted stress and strain provides a more accurate measurement of the magnetostrictive characteristics of the test sample. Finally, this horizontal orientation eliminates the need for damping weights used in the prior art. These and other advantages of the present invention will be discussed in the description of the preferred embodiment hereinbelow.

BRIEF DESCRIPTION OF THE DRAWINGS

FIG. 3 illustrates a test fixture required for supporting a test sample.

DESCRIPTION OF THE PREFERRED EMBODIMENT

Figure 1:
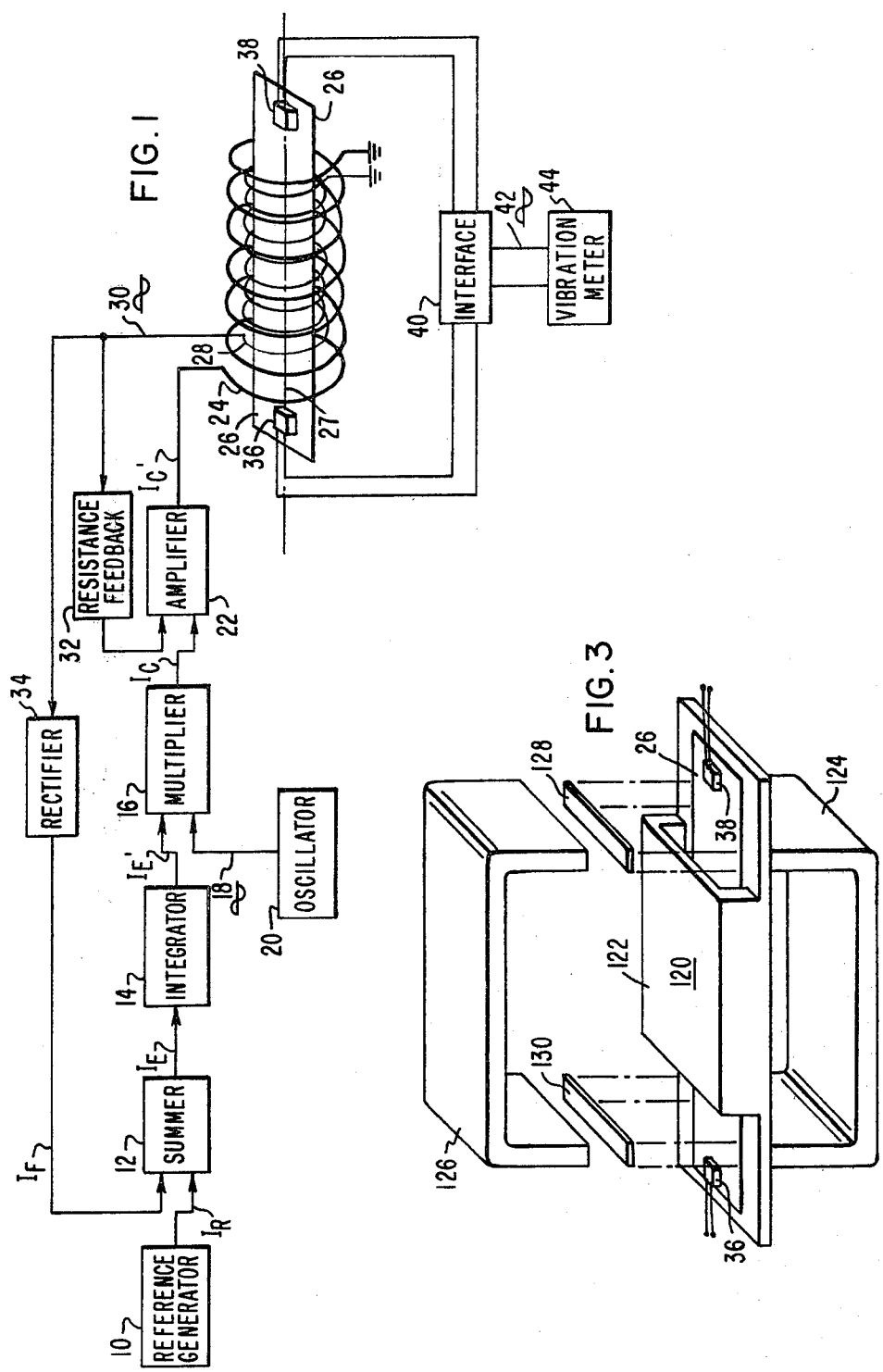
FIG. 1 is a block diagram of an apparatus for measuring dynamic magnetostriction constructed in accordance with the present invention.

Referring to FIG. 1, a reference generator 10 produces a reference signal $I_R$ representative of the magnetic field to be induced. The reference signal $I_R$ is input to a summer 12. The summer 12 also receives a feedback signal $I_F$ representative of the magnetic field actually induced. The production of the feedback signal $I_F$ is discussed hereinbelow. The summer 12 adds the reference signal $I_R$ and the feedback signal $I_F$ producing an error signal $I_E$. The error signal $I_E$ is representative of the difference between the desired magnetic field and the magnetic field actually induced. The error signal $I_E$ is input to an integrator 14. The output of the integrator 14 is the integral of the error signal $I_E'$ and is input to a multiplier 16. The multiplier 16 also receives a variable frequency sine wave 18 produced by an oscillator 20. The multiplier multiplies the integral of the error signal $I_E'$ with the sine wave 18 producing an induction control signal $I_C$. The induction control signal $I_C$ is amplified by an amplifier 22. The amplified induction control signal $I_C'$ is input to an excitation coil 24. The excitation coil 24 is wound about a test sample 26. The excitation coil 24 induces, in response to the amplified induction control signal $I_C'$, a magnetic field parallel to the X axis, represented by the broken line 27, of the test sample.

A sensing coil 28 is also wound about the test sample 26. The sensing coil 28 produces a signal 30 which is fed back through a resistance feedback path 32 to the amplifier 22. The resistance feedback path 32 provides waveform control. The signal 30 is also input to a rectifier 34. The rectifier 34 produces the feedback signal $I_F$ that is input to the summer 12. The rectifier feeback path 34 provides induction control.

A first accelerometer 36 is mounted on a first end of the test sample 26. A second accelerometer 38 is mounted on the opposite end of the test sample 26. The accelerometers 36 and 38 are connected to an interface circuit 40. The interface circuit 40 produces, in response to the accelerometers 36 and 38, a first electrical signal 42 representative of the acceleration of the test sample 26 due to the induced magnetic field. The first electrical signal 42 is input to a vibration meter 44. The vibration meter 44 integrates the first electrical signal producing a second electrical signal representative of the velocity of the test sample 26 due to the induced magnetic field. The vibration meter integrates the second electrical signal producing a third electrical signal representative of the displacement of the test sample 26 due to the induced magnetic field. The vibration meter 44 has display means for displaying the first electrical signal 42 representative of the accleration, the second electrical signal representative of the velocity, and the third electrical signal representative of the displacement. This concludes the description of the block diagram in FIG. 1.

Figure 2:
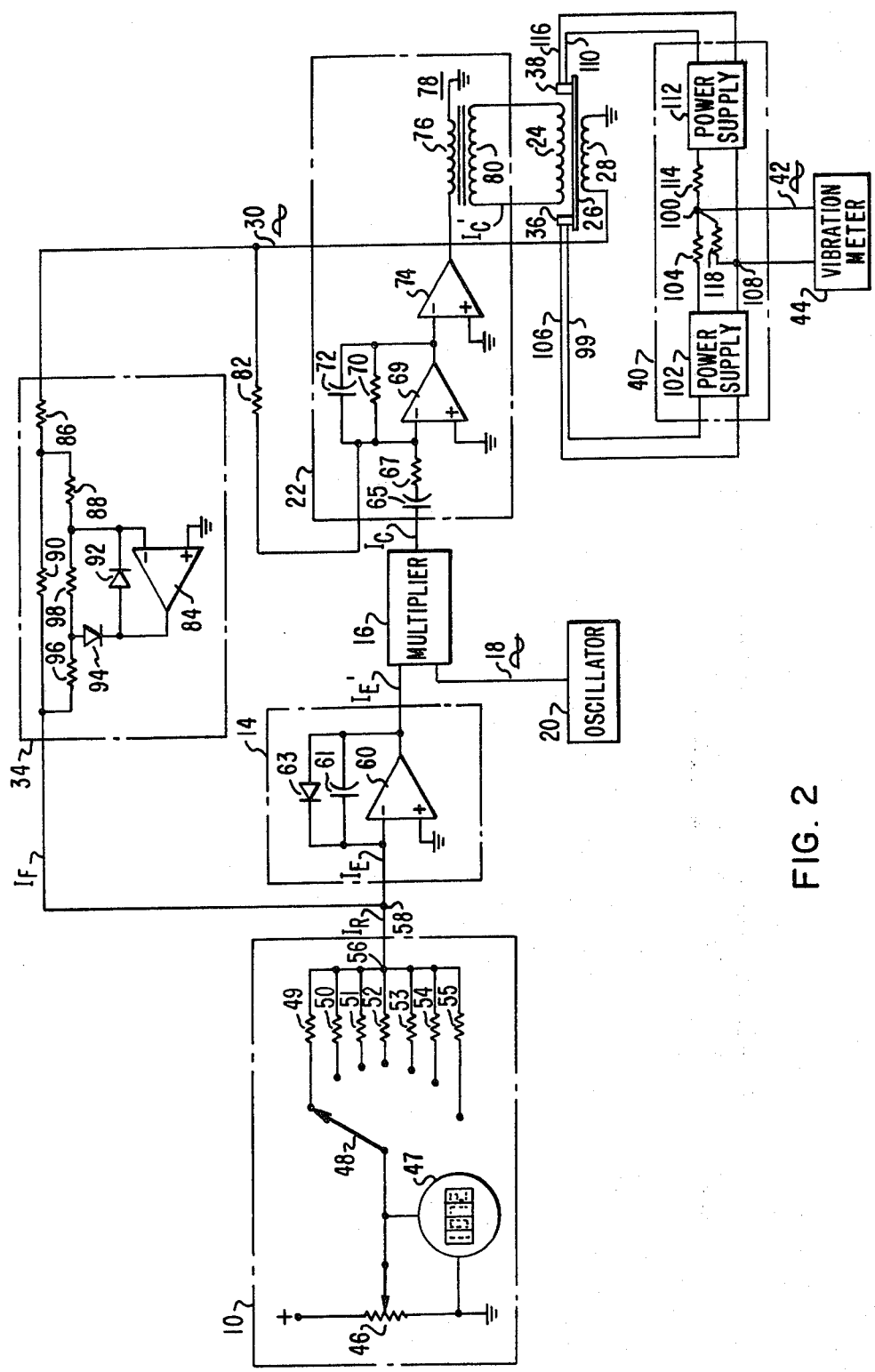
FIG. 2 is an electrical schematic of an apparatus for measuring dynamic magnetostriction constructed in accordance with the present invention.

FIG. 2 is an electrical schematic illustrating the circuit details of the present invention. A potentiometer 46 has a first terminal connected to a positive reference voltage and a second terminal connected to ground. A wiper of the potentiometer 46 is connected to a pole of a switch 48. A digital volt meter 47 is connected between the wiper of the potentiometer 46 and ground. The wiper of the potentiometer 46 is connected to a node 56 through a first connecting resistor 49. The wiper of the potentiometer 46 may alternatively be connected to the node 56 through one of six other connecting resistors 50, 51, 52, 53, 54, and 55 depending upon the position of the switch 48. The reference signal $I_R$ is available at the node 56.

The potentiometer 46, the digital voltmeter 47, the switch 48, and the connecting resistors 49 through 55 form the reference generator 10 shown in FIG. 1. The connecting resistors 49 through 55 are chosen such that each provides a unique reference signal $I_R$ representative of magnetic fields of various strength. The user, after choosing the desired magnetic field strength by setting the switch 48, varies the potentiometer 46 until the voltage shown by the digital voltmeter 47 is equal to the weight of the test sample 26. Setting the potentiometer 46 assures that the desired magnetic field strength selected by setting the switch 48 will be achieved for that particular test sample.

The reference signal $I_R$ is input to a node 58. The node 58 also receives the feedback signal $I_F$. The node 58 is a summing junction and adds the two signals $I_R$ and $I_F$ producing the error signal $I_E$. The node 58 performs the function of the summer 12 shown in FIG. 1.

The error signal $I_E$ is input to an inverting input terminal of an operational amplifier 60. The inverting input terminal of the operational amplifier 60 is connected to an output terminal thereof through the parallel combination of a capacitor 61 and a diode 63. A non-inverting input terminal of the operational amplifier 60 is connected to ground. The operational amplifier 60, the capacitor 61, and the diode 63 form the integrator 14 shown in FIG. 1. The integrated error signal $I_E'$ is available at the output terminal of the operational amplifier 60.

The integrated error signal $I_E'$ and the variable frequency sine wave 18 are input to the multiplier 16. The variable frequency sine wave 18 is typically a 60 Hz signal. The multiplier 16 multiplies the integrated error signal $I_E'$ and the variable frequency sine wave 18 producing the induction control signal $I_C$. Both the multiplier 16 and the oscillator 20 may be commercially available components.

The induction control signal $I_C$ is input to an inverting input terminal of an operational amplifier 69 through the series combination of a capacitor 65 and a resistor 67. The inverting input terminal of the operational amplifier 69 is connected to an output terminal thereof through the parallel combination of a resistor 70 and a capacitor 72. A non-inverting input terminal of the operational amplifier 69 is connected to ground. The output terminal of the operational amplifier 69 is connected to an inverting input terminal of an operational amplifier 74. A non-inverting input terminal of the operational amplifier 74 is connected to ground. An output terminal of the operational amplifier 74 is connected to a primary winding 76 of a step-up transformer 78. The amplified induction control signal $I_C'$ is available at a secondary winding 80 of the transformer 78. The operational amplifiers 69 and 74 together with the step-up transformer 78 form the amplifier 22 shown in FIG. 1.

The excitation coil 24, energized by the amplified induction control signal $I_C'$, induces the magnetic field along the axis of the test sample 26. The sensing coil 28 senses the induced magnetic field and produces the signal 30 responsive thereto. Details of the physical relationship between the excitation coil 24, the sensing coil 28, and the test sample 26 are discussed in relationship with FIG. 3 hereinbelow. The signal 30 is input to the inverting input terminal of the operational amplifier 69 through a resistor 82. The resistor 82 is the resistance feedback 32 shown in FIG. 1. The ratio of the resistor 82 to the resistor 67 determines the closed loop gain of the amplifier 22. The capacitor 72 is included in order to avoid oscillation. A transformer ratio of 1:3 is typical for the step-up transformer 78.

The signal 30 is also input to an inverting input terminal of an operational amplifier 84 through the series combination of a resistor 86 and a resistor 88. The junction of the resistors 86 and 88 is connected to the node 58 through a resistor 90. The inverting input terminal at the operational amplifier 84 is connected to an output terminal thereof through a diode 92. The output terminal of the operational amplifier 84 is connected to the node 58 through the series combination of a diode 94 and a resistor 96. The junction of the diode 94 and the resistor 96 is connected to the inverting input terminal of the operational amplifier 84 through a resistor 98. A non-inverting input terminal of the operational amplifier 84 is connected to ground. The feedback signal $I_F$ is available at the output terminal of the operational amplifier 84. The operational amplifier 84 and associated components form the rectifier 34 shown in FIG. 1.

The first accelerometer 36 mounted on the first end of the test sample 26 has a conductor 99 connected to a node 100 through a power suply 102 and a resistor 104. The accelerometer 36 has a second conductor 106 connected to a node 108 through the power supply 102. The second accelerometer 38 mounted on the opposite end of the test sample 26 has a first conductor 110 connected to the node 100 through a power supply 112 and a resistor 114. The accelerometer 38 has a second conductor 116 connected to the node 108 through the power supply 112. The node 100 is connected to the node 108 through a resistor 118. The accelerometers 36 and 38 are thus connected in parallel. However, since the accelerometers have an opposite orientation on the test sample 26 the first electrical signal 42, available at the node 100, is a differential signal. The power supplies 102 and 112 together with the resistors 104, 114, and 118 form the interface circuit 40 shown in FIG. 1. The accelerometers 36 and 38 may be commercially available accelerometers such as Vibra Metrics, Inc., Model No. M6021. The power supplies 102 and 112 may be commercially available power supplies such as Vibra Metrics Model No. P1000B.

The first electrical signal 42 is input to the vibration meter 44. The distance between the accelerometers 36 and 38 is also input to the vibration meter 44. The vibration meter 44 may be a commercially-available vibration meter such as Vibra Metrics Model No. M8DMP. The vibration meter 44 integrates the first electrical signal 42 producing the second electrical signal representative of the velocity of the test sample 26 due to the induced magnetic field. The vibration meter 44 also integrates the second electrical signal producing the third electrical signal representative of the displacement of the test sample 26 due to the induced magnetic field. The vibration meter 44 has a display for displaying either the first, second or third electrical signal. For the first electrical signal 42 to be a waveform capable of providing useful information upon integration, it is important that the magnetic field is maintained spatially uniform, sinusoidal, and of constant peak amplitude. Accordingly, the sensing coil 28, the resistance feedback 32 which provides waveform control, and the rectifier 34 which provides induction control are important features of the present invention.

Another important feature of the present invention is a test fixture 120 shown in FIG. 3. The test fixture 120 is a sheath-like structure open at both ends. The test sample 26 is placed in the test fixture 120 such that the ends of the test sample 26 are exposed. The accelerometers 36 and 38 are mounted on the exposed ends of the test sample 26. The test fixture 120 thus provides support for the test sample 26 such that the test sample does not bow under its own weight or bend because of the weight of the accelerometers. Both the excitation coil 24 and the sensing coil 28 (not shown in FIG. 3) are wound about the center portion 122 of the test fixture 120. Thus, the test fixture supports the weight of both the excitation coil 24 and the sensing coil 28 and prevents the coils from coming in contact with the test sample 26. The test fixture 120 may be made of a material having a low magnetic permeability such as Micarta.

The test fixture 120 is supported by a lower yoke 124. An upper yoke 126 is positioned on the test fixture 120 intermediate of the accelerometers 36 and 38. The upper yoke 126 is prevented from coming into contact with the test fixture 120 by rectangular blocks 128 and 130 constructed of a resilient material. Further, the entire weight of the upper yoke is not supported by the test fixture 120. The upper yoke 126 is supported by means (not shown) such that the weight of the upper yoke 126 provides sufficient force to restrain motion of the test sample 26 in a direction perpendicular to the induced magnetic field but will not interfere with the motion of the test sample 26 in the direction parallel to the induced magnetic field. The yokes 124 and 126 ensure that the induced magnetic field will be spatially uniform. The yokes 124 and 126 are constructed of a material having a high magnetic permeability. The rectangular blocks 128 and 130 may be constructed of natural rubber.

Briefly reviewing, a reference signal representative of a magnetic field to be induced in a test sample is added to a feedback signal representative of the magnetic field actually induced in the test sample. This addition produces an error signal which is integrated. The integrated error signal is multiplied with a sine wave producing an induction control signal. The induction control signal is amplified and input to an excitation coil which induces the magnetic field. A sensing coil senses the induced magnetic field and produces a feedback signal used to maintain a sinusoidal shape and a constant peak amplitude of the induced magnetic field. Accelerometers mounted on the test sample produce a first electrical signal representative of the acceleration of the test sample due to the induced magnetic field. The first electrical signal is integrated producing a second electrical signal representative of the velocity of the test sample due to the induced magnetic field. The second electrical signal is integrated producing a third electrical signal representative of the displacement of the test sample due to the induced magnetic field. The third electrical signal is a measurement of the magnetostrictive movement of the test sample.

What is claimed is:

1. An apparatus for measuring dynamic magnetostriction along an axis of a test sample, comprising:
   means for producing an adjustable reference signal representative of a desired magnetic field;
   means for producing a variable frequency sinusoidal signal;
   means for multiplying said reference signal and said sinusoidal signal producing an induction control signal;
   means for inducing a variable frequency magnetic field along said axis of said test sample in response to said induction control signal;
   means for sensing said induced magnetic field and for producing a feedback signal representative thereof, said feedback signal being input to said induction means such that said induced magnetic field has a uniform sinusoidal waveform;
   means for adding said reference signal and said feedback signal producing an indication of the difference between the amplitude of the desired magnetic field and the amplitude of the induced magnetic field such that said induced magnetic field has a constant peak amplitude;
   means for holding said test sample without imparting mechanical strain thereto and for maintaining said induced magnetic field spatially uniform;
   means for measuring acceleration rigidly mounted on said test sample, said measuring means producing a first electrical signal representative of the acceleration of said test sample due to said induced magnetic field; and
   circuit means integrating said first electrical signal producing a second signal representative of the velocity of said test sample due to said induced magnetic field, said circuit means also integrating said second signal producing a third signal representative of the displacement of said test sample along said axis due to said induced magnetic field.

2. The magnetostriction measuring apparatus of claim 1 wherein the frequency of the magnetic field is 60 Hz.

3. The magnetostriction measuring apparatus of claim 1 wherein the means for holding the test sample includes a pair of iron yokes for providing a path of high magnetic permeability substantially enclosing the test sample such that the induced magnetic field is substantially spatially uniform throughout the area of said test sample.

4. The magnetostriction measuring apparatus of claim 3 wherein the means for holding the test sample includes a sheath-like test fixture receiving and horizontally supporting the test sample, said text fixture having a low magnetic permeability.

5. The magnetostriction measuring apparatus of claim 4 wherein the sensing means includes a sensing coil wound about the test fixture.

6. The magnetostriction measuring apparatus of claim 1 including an integrator responsive to the sum of the reference signal and the feedback signal, and wherein the means producing the variable frequency sinusoidal signal includes an oscillator, and wherein the means for multiplying is responsive to both said integrator and said oscillator.

7. The magnetostriction measuring apparatus of claim 5 wherein the induction means includes an amplifier responsive to the induction control signal, and includes a transformer having a primary and a secondary winding, said primary winding responsive to said amplifier, and includes an excitation coil responsive to said secondary winding, said excitation coil wound about both the test fixture and the sensing coil such that the induced magnetic field is induced along the axis of the test sample.

8. The magnetostriction measuring apparatus of claim 1 including a precision rectifier rectifying the feedback signal before addition to the reference signal.

9. The magnetostriction measuring apparatus of claim 1 wherein the means producing the adjustable reference signal includes a potentiometer set to a value representative of the weight of the test sample, and includes an adjustable resistor set to a value representative of a predetermined desired magnetic field, said adjustable resistor connected in series with said potentiometer.

10. The magnetostriction measuring apparatus of claim 1 wherein the means for measuring acceleration includes a first accelerometer rigidly mounted on a first end of the test sample, and includes a second accelerometer rigidly mounted on a second end of said test sample.

11. The magnetostriction measuring apparatus of claim 10 including an interface circuit producing the first electrical signal in response to both the first and second accelerometers.

12. The magnetostriction measuring apparatus of claim 11 wherein the circuit means includes a display means responsive to both the second signal and the third signal.

13. An apparatus for measuring dynamic magnetostriction along an axis of a test sample, comprising:
a test fixture receiving and horizontally supporting said test sample;
a sensing coil wound about said test fixture;
an excitation coil wound about both said test fixture and said sensing coil;
means for energizing said excitation coil;
means responsive to said sensing coil for producing a feedback signal;
means for producing an adjustable reference signal;
means for adding said feedback signal and said reference signal producing an error signal;
means for integrating said error signal;
means for producing a 60 Hz sine wave;
means for multiplying said integrated error signal and said sine wave producing an induction control signal controlling said means for energizing said excitation coil such that a spatially uniform, 60 Hz, sinusoidal, magnetic field of constant peak amplitude is induced along said axis of said test sample;
a first accelerometer rigidly mounted on a first end of said test sample;
a second accelerometer rigidly mounted on a second end of said test sample;
an interface circuit producing, in response to said first and second accelerometers, a first electrical signal representative of the acceleration of said test sample due to said magnetic field;
circuit means integrating said first electrical signal producing a second signal representative of the velocity of said test sample due to said magnetic field, said circuit means also integrating said second signal producing a third signal representative of the displacement of said test sample along said axis due to said magnetic field.

* * * * *